US006492271B1

United States Patent
Uozumi et al.

(10) Patent No.: US 6,492,271 B1
(45) Date of Patent: Dec. 10, 2002

(54) SEMICONDUCTOR DEVICE AND METHOD OF MANUFACTURING THE SAME

(75) Inventors: Yoshihiro Uozumi, Yokohama (JP); Hisashi Okuchi, Yokohama (JP); Soichi Nadahara, Yokohama (JP); Yoshihiro Ogawa, Yokohama (JP); Hiroshi Tomita, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 2 days.

(21) Appl. No.: 09/609,711

(22) Filed: Jun. 30, 2000

(30) Foreign Application Priority Data

Jun. 30, 1999 (JP) .......................................... 11-187023
Jun. 22, 2000 (JP) ...................................... 2000-187995

(51) Int. Cl.[7] .......................................... H01L 21/302
(52) U.S. Cl. ...................... 438/689; 438/687; 438/688; 438/712
(58) Field of Search ............................... 438/687, 688, 438/689, 712–720

(56) References Cited

U.S. PATENT DOCUMENTS 6,191,047 B1 * 2/2001 Li et al. ..................... 438/739
6,218,297 B1 * 4/2001 Marsh ........................ 438/654
6,261,953 B1 * 7/2001 Uozumi ...................... 438/687
6,261,978 B1 * 7/2001 Chen et al. ................. 438/981
6,316,359 B1 * 11/2001 Simpson ..................... 438/678

FOREIGN PATENT DOCUMENTS

| JP | 10-64866 | 3/1980 |
| JP | 8-153788 | 6/1996 |
| JP | 9-64006 | 3/1997 |
| JP | 9-293727 | 11/1997 |
| JP | 10-50986 | 2/1998 |

OTHER PUBLICATIONS

Copy of U.S. patent application Ser. No. 09/494,025, filed Jan. 31, 2000.

* cited by examiner

Primary Examiner—John F. Niebling
Assistant Examiner—Olivia Luk
(74) Attorney, Agent, or Firm—Finnegan, Henderson, Farabow, Garrett & Dunner, L.L.P.

(57) ABSTRACT

A titanium nitride film is selectively etched relative to a tungsten film by using as an etchant a solution containing hydrochloric acid and a hydrogen peroxide solution, the molar ratio of the hydrogen peroxide in the hydrogen peroxide solution to hydrogen chloride in the hydrochloric acid being 1/100 or less.

25 Claims, 10 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Applications No. 11-187023, filed Jun. 30, 1999; and No. 2000-187995, filed Jun. 22, 2000, the entire contents of which are incorporated herein by reference.

BACKGROUND OF THE INVENTION

The present invention relates to a semiconductor device having a wiring structure capable of preventing a short-circuiting between a W damascene wiring and a plug and a method of manufacturing the same.

Figure 15:
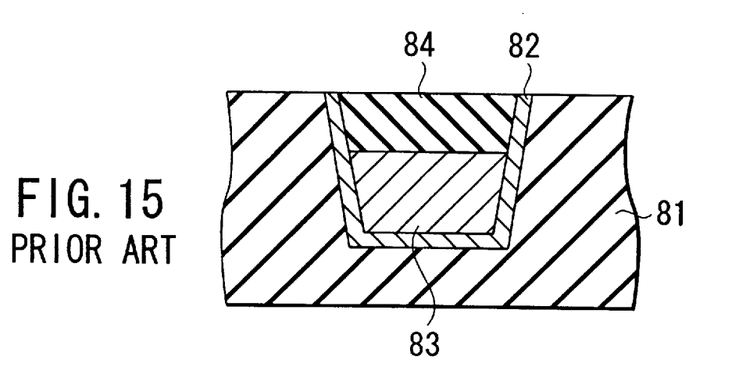
FIG. 15 is a cross sectional view showing a conventional W damascene wiring structure.
Figure 16:
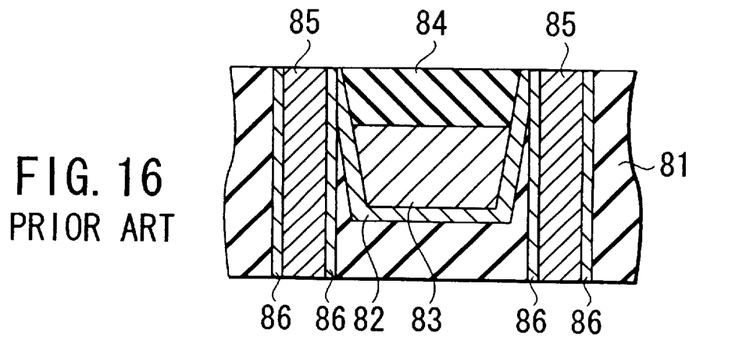
FIG. 16 is a cross sectional view showing the problem inherent in the W damascene structure shown in FIG. 15.

A buried tungsten wiring structure (W damascene wiring structure) is used nowadays in many cases in a semiconductor device such as DRAM. FIG. 15 shows the conventional W damascene wiring structure, comprising an interlayer insulating film 81, a barrier metal layer 82, a W wiring 83, and a cap insulating film 84. The barrier metal film 82 is formed of a titanium nitride film.

In the W damascene wiring structure shown in FIG. 15, the entire W wire 83 is covered with the barrier metal film 82 and the cap insulating film 84, making it possible to prevent an adverse effect from being given to the device by the tungsten diffusion.

In the case of using the W damascene wiring structure shown in FIG. 15, the aligning mark cannot be recognized because the surface of the interlayer insulating film 81 is not planarized and, thus, deviation in alignment tends to take place. Therefore, where a contact hole is made in the interlayer insulating film 81 for forming a plug 85, a short-circuiting tends to take place between the W wiring 83 and the plug 85.

Figure 17A:
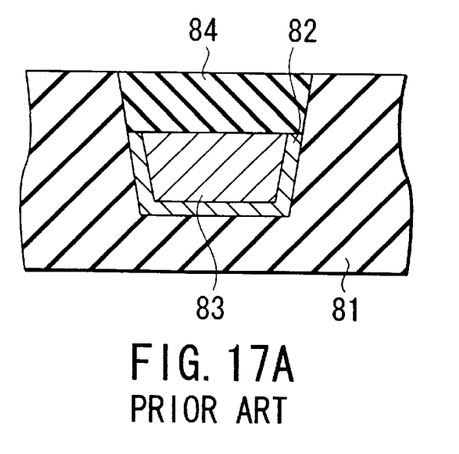
FIGS. 17A and 17B are cross sectional views showing a wiring structure capable of resolving the problem inherent in the W damascene wiring structure shown in FIG. 16.
Figure 17B:
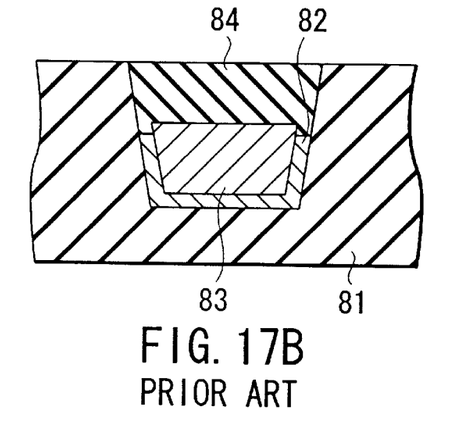

In order to overcome the above-noted problem, it is conceivable to employ the wiring structure as shown in FIG. 17A or FIG. 17B. In the wiring structure shown in each of these drawings, the barrier metal film 82 in an upper portion of the wiring groove, said barrier metal film 82 causing a short-circuiting problem, is removed.

Figure 18A:
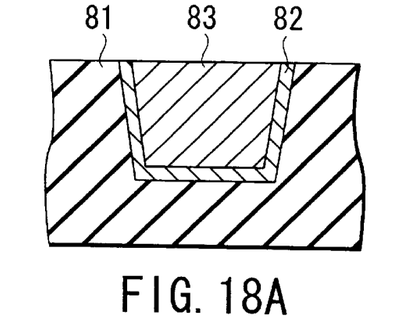
FIGS. 18A to 18D are cross sectional views showing the etching method required for forming the wiring structure shown in FIGS. 17A and 17B.
Figure 18B:
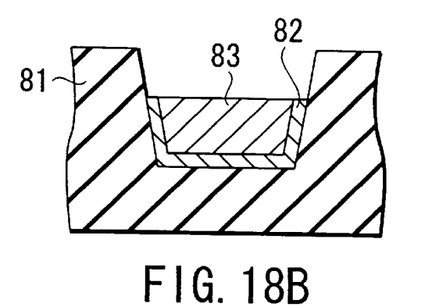
Figure 18C:
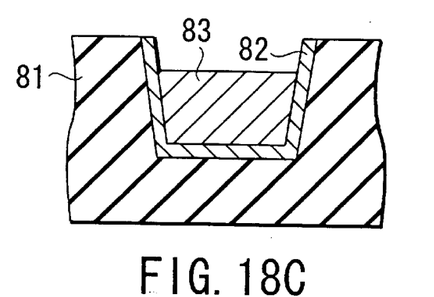
Figure 18D:
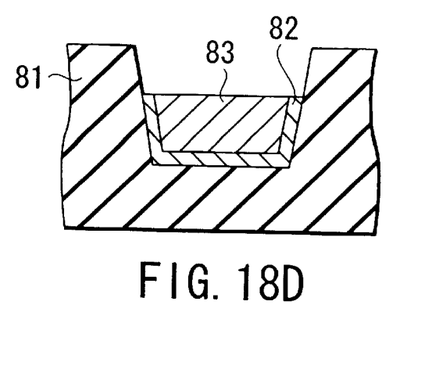

In order to realize the wiring structure shown in FIG. 17A, the barrier metal film 82 and the W wiring 83 must be non-selectively etched as shown in FIG. 18A. Alternatively, it is necessary to selectively etch the barrier metal film 82 relative to the W wiring 83, as shown in FIG. 18B. Likewise, similar non-selective or selective etching must be performed for realizing the wiring structure shown in FIG. 18B.

The etching includes a dry etching and a wet etching. The dry etching includes an anisotropic etching called RIE (Reactive Ion Etching) and an isotropic etching called CDE (Chemical Dry Etching). However, it is difficult to perform the non-selective etching and the selective etching shown FIGS. 18A and 18B by these etching methods. Particularly, it is substantially impossible to achieve the selective etching shown in FIG. 18B.

It should also be noted that a CF-based gas, which produces a serious problem in terms of the earth environment, is used as a raw material gas in the dry etching. Further, a wet etching is performed after the dry etching for removing the by-products of the dry etching. It follows that the dry etching process is disadvantageous in the number of process steps required and the cost, compared with the wet etching process.

On the other hand, it is known to the art concerning the wet etching that tungsten and titanium nitride can be etched by chemicals having an oxidizing power. To be more specific, tungsten and titanium nitride can be dissolved in hydrochloric acid mixed with a hydrogen peroxide solution, i.e., hydrochloric acid allowed to produce an oxidizing power.

In general, a mixed solution of hydrochloric acid and a hydrogen peroxide solution is used as a cleaning solution and called SC2. In many cases, each of hydrochloric acid and hydrogen peroxide solution available on the market has a concentration of about 30 to 35%. These hydrochloric acid and hydrogen peroxide solution are mixed at a mixing ratio of 1:1 and the mixture is diluted with pure water in an amount 5 to 6 times as much as the amount of the original mixture for use as an etchant, as disclosed in, for example, Japanese Patent Disclosure (Kokai) No. 10-64866, Japanese patent Disclosure No. 8-153788 and Japanese Patent Disclosure No. 9-64006. Incidentally, the molar ratio of the hydrogen peroxide to hydrogen chloride in the hydrochloric acid is about 1.

If tungsten and titanium nitride are etched with the etchant described above, the etching rate of the tungsten is about 4 to 5 times as high as that of titanium nitride. Particularly, tungsten can be etched with only the hydrogen peroxide solution that is weakly acidic. It follows that in the conventional wet etching using a mixed solution of hydrochloric acid and a hydrogen peroxide solution, it was difficult to increase the selectivity ratio of titanium nitride relative to tungsten to exceed 1.

Also, the cleaning using a mixed solution of sulfuric acid and a hydrogen peroxide solution is called an SP cleaning, which is generally employed for removing a resist film. Disclosed in, for example, Japanese Patent Disclosure No. 10-50986 is an etching method for selectively etching a TiN film relative to a W film, a Cu film or a TiSi film by using the mixed solution noted above. In this method, it is possible to achieve at least 20 nm/min of the TiN film etching rate and at least 7 nm/min of the W film etching rate by using a mixed solution consisting of 1 part of sulfuric acid and 6 parts of a hydrogen peroxide solution and by setting the process temperature at 130° C. However, if the process temperature exceeds 100° C., it is difficult to use a pure water as a diluent, leading to an increased amount of the mixed solution consisting of sulfuric acid and hydrogen peroxide solution used as the etchant.

Another difficulty is brought about in the case of the batch treatment in which a plurality of wafers are processed simultaneously by employing the etching method described above. Specifically, in the case of etching a thin TiN film that is about 20 nm thick, it is difficult to achieve a uniform etching because the TiN film exhibits a high etching rate. A similar etching method, which is disclosed in Japanese Patent Disclosure No. 9-293727, also gives rise to a similar problem.

BRIEF SUMMARY OF THE INVENTION

An object of the present invention is to provide a method of manufacturing a semiconductor device, which permits easily performing a selective etching and a non-selective etching in a tungsten-titanium nitride system.

Another object of the present invention is to provide a semiconductor device having a wiring structure that permits preventing a short-circuiting between a W damascene wiring and a plug, which can be easily achieved by the method of the present invention for manufacturing a semiconductor device.

According to a first aspect of the present invention, which is intended to achieve the objects described above, there is provided a semiconductor device, comprising a silicon oxide film having a wiring groove, a silicon nitride film formed on a side wall of the wiring groove and not filling the side wall, a first tungsten film formed to extend from the bottom of the wiring groove to reach a central portion of the side wall of the wiring groove and thinner in the side wall portion than the central portion of the wiring groove, a titanium nitride film formed between the first tungsten film and the side wall of the wiring groove, a second tungsten film formed between the titanium nitride film and the first tungsten film and thinner than the first tungsten film, and a silicon nitride film formed on the second tungsten film to fill the wiring groove.

According to a second aspect of the present invention, there is provided a method of manufacturing a semiconductor device, comprising an etching step using a mixed solution containing hydrochloric acid and a hydrogen peroxide solution, the molar ratio of hydrogen peroxide in the hydrogen peroxide solution to hydrogen chloride in the hydrochloric acid being 1/100 or less.

According to a third aspect of the present invention, there is provided a method of manufacturing a semiconductor device, comprising an etching step for selectively etching titanium nitride relative to tungsten by using a mixed solution containing hydrochloric acid and a hydrogen peroxide solution, the molar ratio of hydrogen peroxide in the hydrogen peroxide solution to hydrogen chloride in the hydrochloric acid being 1/10 or less.

It is desirable for the molar ratio of hydrogen peroxide to hydrogen chloride to be at least 1/10,000 and, more desirably, to fall within a range of between 1/10,000 and 1/100. It is also desirable for the temperature of the mixed solution to be at least 70° C.

According to a fourth aspect of the present invention, there is provided a method of manufacturing a semiconductor device, wherein titanium nitride is selectively etched relative to tungsten by using a mixed solution containing sulfuric acid, hydrogen peroxide and water under the condition that the mass of hydrogen peroxide within the mixed solution is not larger than 1,000 mg per liter of the mixed solution (or the mass percentage of the hydrogen chloride based on the solution is not higher than 0.35%).

According to the research conducted by the present inventors, the selectivity ratio of titanium nitride relative to tungsten can be markedly improved by using a mixed solution in which the molar ratio of hydrogen peroxide to hydrogen chloride is not larger than 1/10 (or the mass percentage is not higher than 0.35%), particularly, not larger than 1/100, (or the mass percentage is not higher than 0.035%) which is markedly smaller than in the conventional etchant.

The molar ratio (or mass percentage) noted above correspond to the selectivity ratio noted above. Therefore, in order to obtain a predetermined selectivity ratio, it does not suffice to set the molar ratio at 1/100 or lower (or the mass percentage 0.35% or lower). In other words, it is necessary to control the amounts of hydrogen chloride and hydrogen peroxide within the solution so as to obtain a predetermined molar ratio not larger than 1/100 (or the mass percentage not higher than 0.35%).

It has also been found that tungsten and titanium nitride can be etched non-selectively by using a mixed solution in which the molar ratio of hydrogen peroxide to hydrogen chloride falls within a range of between 1/10 and 4/10. It follows that the present invention using the particular mixed solution as an etchant makes it possible to realize easily both a selective etching and non-selective etching of a tungsten-titanium nitride system and also makes it possible to realize a wiring structure that permits preventing a short-circuiting between the W damascene wiring and the plug.

Further, according to the research conducted by the present inventors, it is possible to markedly improve the selectivity ratio of titanium nitride relative to tungsten in selectively etching titanium nitride relative to tungsten by using an etchant consisting of a mixed solution containing sulfuric acid, hydrogen peroxide and water by controlling the mass of hydrogen peroxide in the mixed solution at 1,000 mg or less, particularly, 300 mg or less, per liter of the mixed solution. Naturally, the present invention using the particular etchant makes it possible to realize easily a selective etching of titanium nitride relative to tungsten. What should also be noted is that the etching of a high selectivity is scarcely deteriorated even in the case of using the mixed solution at a high temperature (typically at 80° C. or higher), compared with the etching using a mixed solution containing hydrochloric acid.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.

First Embodiment

Figure 1:
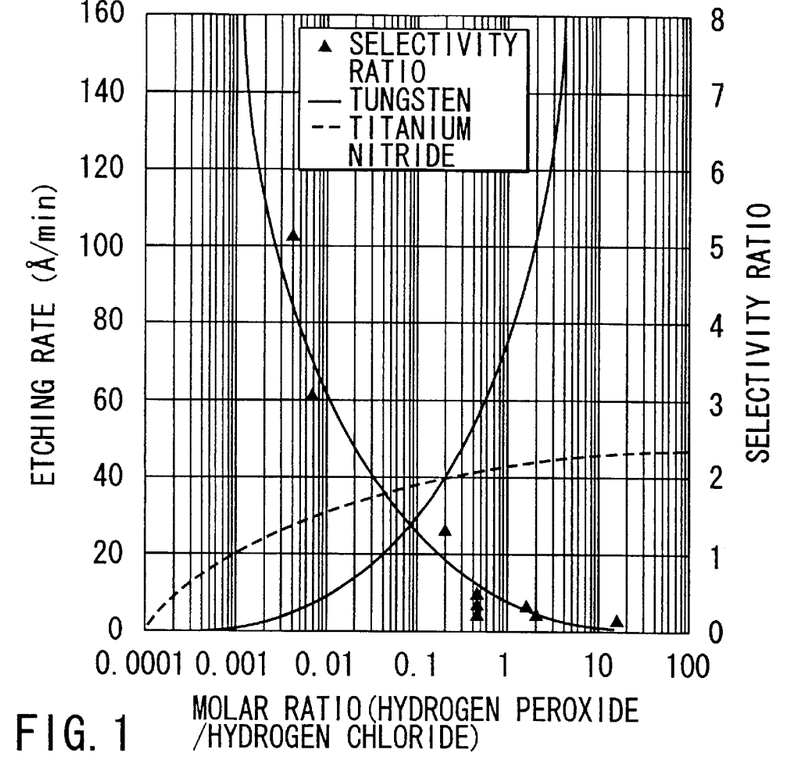
FIG. 1 is a graph showing the relationship among the etching rates of titanium nitride and tungsten, the molar ratio of hydrogen peroxide to hydrogen chloride, and the selectivity ratio (titanium nitride/tungsten)

The etching rates of titanium nitride and tungsten were measured by using mixed aqueous solutions containing various molar ratios of hydrochloric acid to a hydrogen peroxide ($H_2O_2$) solution. FIG. 1 is a graph showing the selectivity ratios (titanium nitride/tungsten) obtained from the experiment.

The etching was carried out at 70 to 80° C. The mass percentage of the hydrogen peroxide solution based on the mixed aqueous solution was 35%, and the mass percentage of hydrochloric acid based on the mixed aqueous solution was 5%. Similar experiments were conducted by changing the mass percentage of hydrochloric acid to 20% and 30%, with the mass percentage of the hydrogen peroxide solution held stationary at 35%, to obtain a graph similar to the graph of FIG. 1. What has been clarified is that mass percentage (mols) of the hydrogen peroxide solution is very important.

FIG. 1 shows that, where the molar ratio of hydrogen peroxide to hydrogen chloride is larger than 1/10 and not larger than 4/10, the selectivity ratio is about 1. It is also seen that, if the molar ratio is not larger than 1/10, the selectivity ratio is drastically improved. However, it has also been found that, since the etching rate is decreased with decrease in the absolute amount of hydrogen peroxide, the practical etching rate of titanium nitride is achieved at the molar ratio of about 1/10,000.

Further, the etching rate at each temperature was measured by changing the temperature of the solution having the same molar ratio. It has been found that the etching rate of each of titanium nitride and tungsten is increased with increase in temperature. The selectivity ratio has also been found to increase with increase in temperature.

Figure 2:
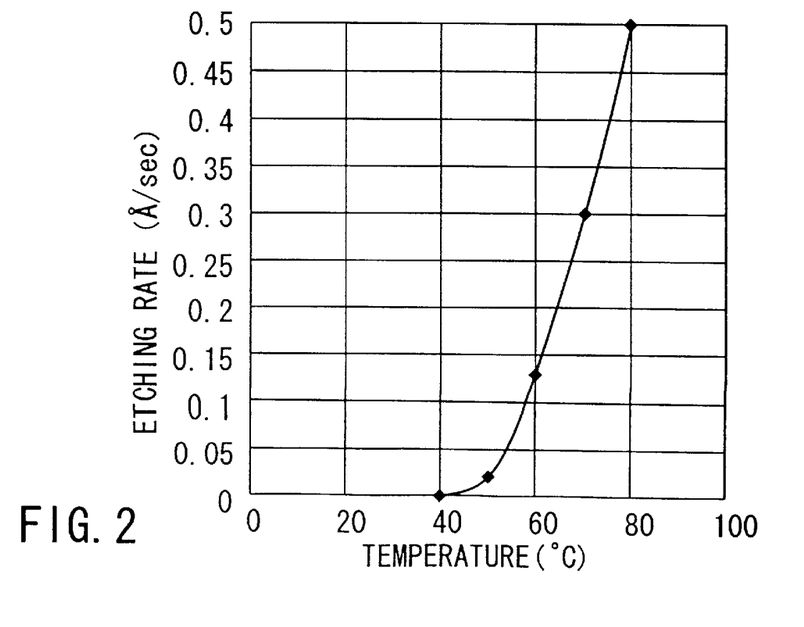
FIG. 2 is a graph showing the relationship between the etching rate of titanium nitride and temperature.

FIG. 2 shows the relationship between the etching rate of titanium nitride and the temperature in the case where the molar ratio is 8/10,000. It is clearly seen from FIG. 2 that the etching rate of titanium nitride is greatly increased if the temperature exceeds, particularly, 70° C.

Figure 3:
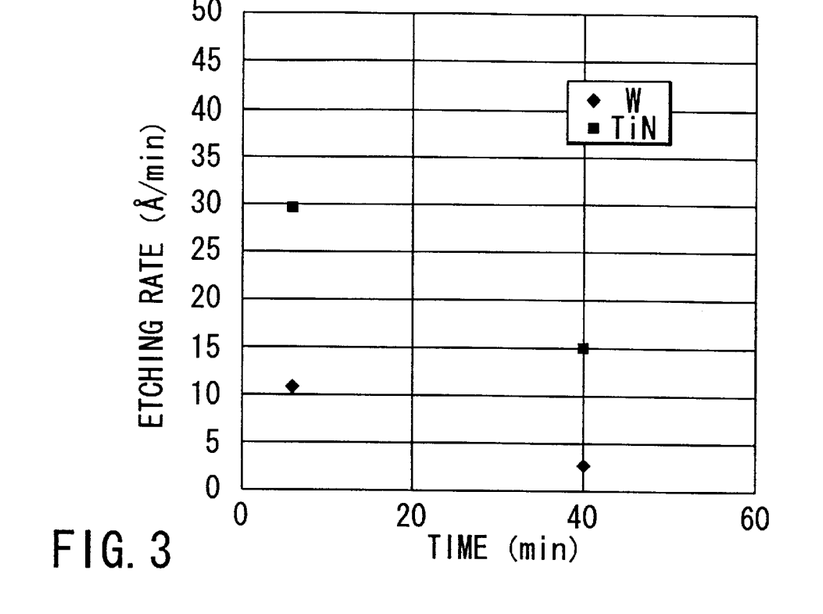
FIG. 3 is a graph showing the etching rates of tungsten and titanium nitride 5 minutes and 40 minutes after mixing of hydrochloric acid and a hydrogen peroxide solution.

It should be noted that, if a mixed solution consisting of hydrochloric acid and hydrogen peroxide is maintained at a high temperature, the etching rate is changed by the decomposition and evaporation of hydrogen peroxide. Tungsten and titanium nitride were etched with a mixed solution maintained at 80° C. and having a molar ratio of hydrogen peroxide to hydrochloric acid of 8/1,000. The etching rates of tungsten and titanium nitride 5 minutes after the mixing of hydrochloric acid and hydrogen peroxide were found to be 1 nm/min and 3 nm/min, respectively, and were also found to have markedly diminished to 0.3 nm/min and 1.5 nm/min, respectively, 40 minutes after the mixing. Etching methods capable of overcoming these inconveniences will be described in the following second and third embodiments.

Second Embodiment

Figure 4:
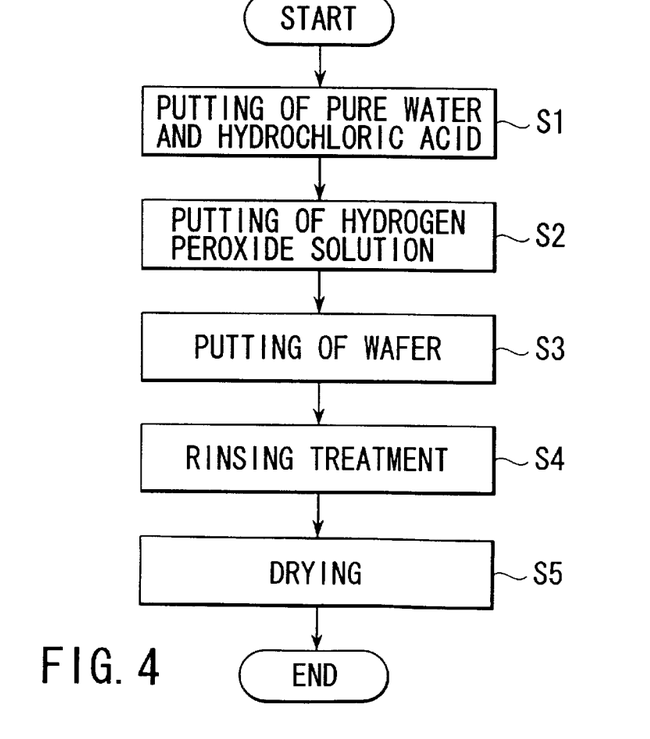
FIG. 4 is a flow chart showing the wet etching method according to a second embodiment of the present invention.
Figures 5, 6:
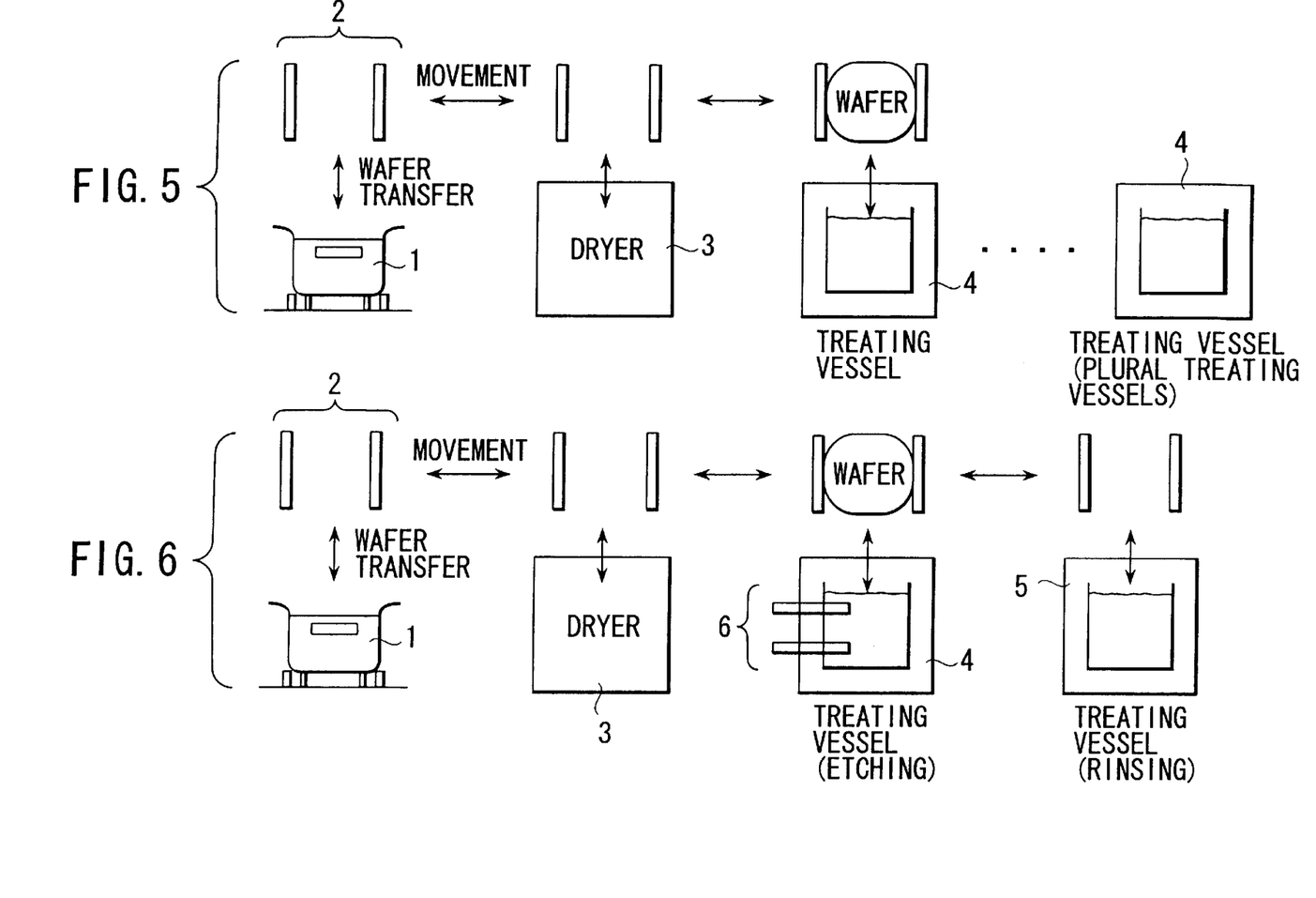
FIG. 5 schematically shows the wet etching apparatus used in the second embodiment of the present invention.
FIG. 6 schematically shows the wet etching apparatus according to a third embodiment of the present invention.

FIG. 4 is a flow chart showing a wet etching method according to a second embodiment of the present invention. On the other hand, FIG. 5 schematically shows a wet etching apparatus used in this embodiment. The etching apparatus, which is basically equal in construction to the conventional apparatus, comprises a carrier 1 having a wafer set therein, a transfer robot 2 for transferring the wafer, a dryer 3 for drying the wafer, and a treating vessel 4 for applying an etching treatment and a rinsing treatment to the wafer.

A transfer device is used for transferring the wafer from the carrier 1 to the transfer robot 2 and from the transfer robot 2 to the carrier 1. Also, the carrier 1 having the wafer set therein is arranged at a predetermined position by an inlet port.

In this embodiment, the switching between the etching treatment and the rinsing treatment is carried out by changing the solution housed in the treating vessel 4. Alternatively, it is possible to carry out the etching treatment and the rinsing treatment in different vessels. It is also possible to arrange a plurality of treating vessels 4 conforming with the number of wafers. For example, where two lots of wafers, each lot consisting of 24 wafers, are treated simultaneously, it is necessary to use two treating vessels 4. In other words, the number of lots is equal to the number of treating vessels 4 required.

The etching method in this embodiment will now be described. The etching treatment applied to a certain lot will now be described. Of course, a similar etching treatment is applied to another lot. Also, a tungsten film and a titanium nitride film are formed on each wafer.

In the first step, a wafer is taken out of the carrier 1 by the transfer robot 2 and is transferred to a region above the treating vessel 4. At the same time, a pure water and hydrochloric acid are poured into the treating vessel 4 (step S1). It is possible to adjust the temperature after pouring of the pure water and hydrochloric acid into the treating vessel 4. However, it is desirable pour a pure water warmed to some extent into the treating vessel 4 in view of evaporation of hydrochloric acid.

It was customary in the past to pour a hydrogen peroxide solution into the treating vessel 4 in the step of pouring hydrochloric acid. In this embodiment, however, a hydrogen peroxide solution is not poured into the treating vessel 4 until the wafer is transferred to a region above the treating vessel 4. To be more specific, a hydrogen peroxide solution is poured into the treating vessel 4 by a pouring means (not shown) when the wafer has been transferred to a region above the treating vessel 4 on the basis of a signal denoting the transfer of the wafer (step S2).

The amounts of the hydrogen peroxide solution and hydrochloric acid poured into the treating vessel are chosen to have a molar ratio of hydrogen peroxide to hydrogen chloride specified in the present invention, which was already described in conjunction with the first embodiment. As already described in conjunction with the first embodiment, the molar ratio in the selective etching differs from that in the non-selective etching. Also, since heat is generated if a hydrogen peroxide solution is added to hydrochloric acid, it is desirable to add the hydrogen peroxide solution at a temperature slightly lower than a predetermined temperature.

A predetermined time after the pouring of the hydrogen peroxide solution into the treating vessel 4, the hydrogen peroxide solution is uniformly mixed with hydrochloric acid within the treating vessel 4. In this step, the wafer is put in the treating vessel 4 (step S3).

According to the sequence of putting hydrochloric acid and the hydrogen peroxide solution in the treating vessel 4 described above, the wafer is put in the treating vessel 4 a predetermined time after hydrochloric acid and the hydrogen peroxide solution is mixed so as to ensure a predetermined etching rate. As a result, it is possible to prevent the nonuniformity in the etching rate among the wafers.

In the subsequent step, the solution within the treating vessel 4 is replaced for performing the rinsing treatment as in the prior art (step S4), followed by taking the wafer out of the treating vessel 4 by operating the transfer robot 2 for drying the wafer within the dryer 3 (step S5), thereby finishing the wet etching treatment.

Third Embodiment

FIG. 6 schematically shows the wet etching apparatus according to a third embodiment of the present invention. Those portions of the apparatus which are equal to those portions shown in FIG. 5 are denoted by the same reference numerals so as to omit the detailed description thereof.

The wet etching apparatus according to the second embodiment is basically of the type that the chemicals used are discarded. On the other hand, the wet etching apparatus of the third embodiment is of the type that the chemicals once used are used again. In addition, the apparatus of the third embodiment comprises a treating vessel 5 exclusively used for the rinsing treatment. Further, the apparatus of the third embodiment also comprises a concentration sensor 6 for detecting the concentrations of hydrochloric acid and hydrogen peroxide solution, which is not included in the conventional wet etching apparatus. The concentration sensor 6 utilizes the difference in, for example, the pH value and the oxidation-reduction potential between hydrogen chloride and hydrogen peroxide solution. In this embodiment, the wet etching apparatus comprises a pair of treating vessels 4 and 5. However, it is possible to use a plurality of pairs of treating vessels 4 and 5.

In the third embodiment, the concentrations of hydrogen chloride and hydrogen peroxide solution are detected by the concentration sensor 6 so as to examine whether hydrogen chloride and hydrogen peroxide solution are contained in desired concentrations, i.e., in a desired molar ratio of hydrogen peroxide to hydrogen chloride. Where the detected concentrations fail to meet a desired molar ratio, hydrochloric acid or hydrogen peroxide solution is added to meet the desired concentrations (molar ratio), followed by putting a wafer in the treating vessel 4 so as to ensure a predetermined etching rate and, thus, to prevent the nonuniformity in the etching rate among the wafers. Then, a rinsing treatment is performed within the treating vessel 5, followed by drying the wafer in the dryer 3.

Incidentally, it is possible to adjust the concentration, amount and temperature of the solution within the treating vessel 4 during the waiting time between the completion of the etching treatment within the treating vessel 4 and the etching treatment of the succeeding wafer, though it is not absolutely necessary to perform such an adjustment. The adjustment can be performed in treating the succeeding wafer.

It is possible to employ the sequence that a pure water, hydrochloric acid and a hydrogen peroxide solution are put in the treating vessel 4, followed by controlling the temperature. Alternatively, it is also possible to employ the sequence that a pure water and hydrochloric acid alone are put first in the treating vessel and, then, the temperature is controlled, followed by adding a required amount of a hydrogen peroxide solution immediately before the treatment, as in the second embodiment.

Fourth Embodiment

FIGS. 7A to 7D are cross sectional views collectively showing a method of forming a W damascene wiring according to a fourth embodiment of the present invention.

Figure 7A:
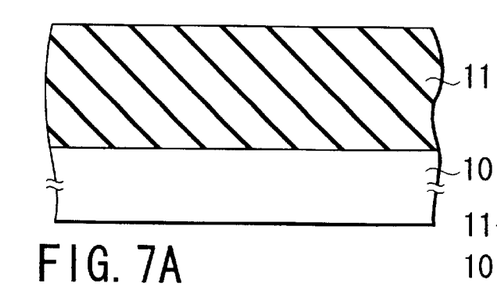
FIGS. 7A to 7G are cross sectional views collectively showing a method of forming a W damascene wiring structure according to a fourth embodiment of the present invention.

In the first step, an interlayer insulating film 11 is formed on a silicon substrate 10 having an integrated circuit device (not shown) formed thereon, as shown in FIG. 7A. In this embodiment, a TEOS film formed by a CVD method by using TEOS as a raw material is used as the interlayer insulating film.

Figure 7B:
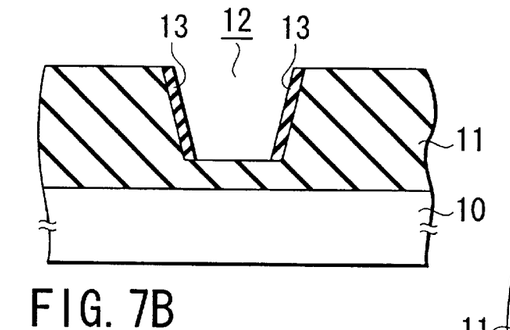

In the next step, a wiring groove 12 is formed on the surface of the interlayer insulating film 11, followed by forming a silicon nitride film 13 on the side wall of the wiring groove 12, as shown in FIG. 7B. The silicon nitride film 13 can be formed by depositing a silicon nitride film on the entire surface, followed by retreating the silicon nitride film by RIE.

Figure 7C:
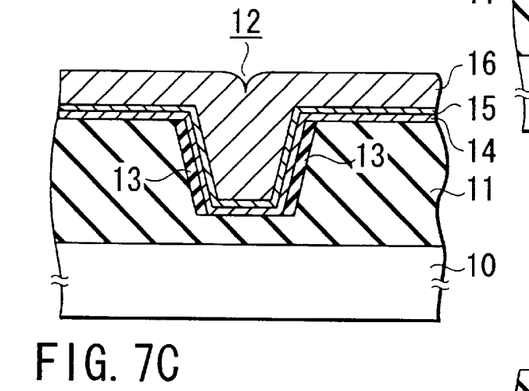

Then, a titanium nitride film 14 and a tungsten thin film 15 are formed on the entire surface. The thickness of each of these titanium nitride film 14 and the tungsten thin film 15 is controlled such that the wiring groove 12 is not filled with these films 14 and 15. After formation of these films 14 and 15, the wiring groove 12 is filled with a tungsten film 16, as shown in FIG. 7C.

Figure 7D:
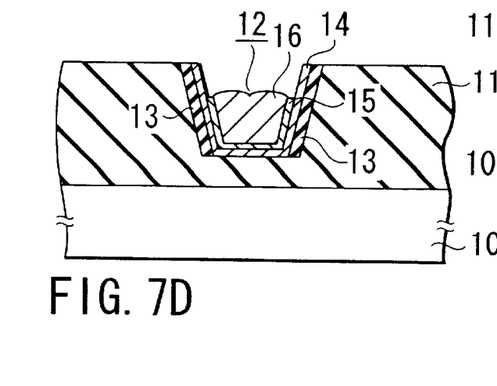

In the next step, those portions of the tungsten film 16, the tungsten thin film 15 and the titanium nitride film 14 which are not positioned within the wiring groove 12 are removed by CMP, followed by applying a dry etching such as RIE or a wet etching to the tungsten thin film 15 and the tungsten film 16 positioned within the wiring groove 12 so as to permit these films 15 and 16 to retreat, as shown in FIG. 7D. Where a seam is present in the tungsten film 16, the central portion of the tungsten film 16 is recessed as shown in the drawing. Also, if the etching rate of the tungsten thin film 15 is somewhat higher than the etching rate of the tungsten film 16, the side wall portion can be made thinner than the wiring portion. In this case, the thickness of the tungsten film 16 remaining within the wiring groove 12 is made smaller in the side wall portion than in the central portion.

Figure 7E:
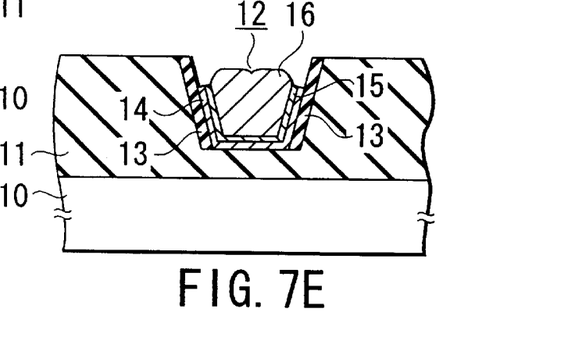

In the next step, the titanium nitride film 14 exposed to the upper side wall of the wiring groove 12 is selectively removed by a wet etching treatment using a solution having a predetermined molar ratio of hydrogen peroxide to hydrochloric acid, which is described in conjunction with the first embodiment, so as to permit the titanium nitride film 14 to retreat to reach substantially the upper end of the tungsten thin film 15, as shown in FIG. 7E.

Figure 7F:
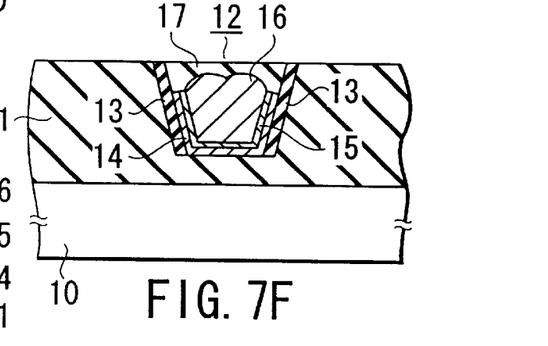

Finally, the wiring groove 12 is filled with a cap insulating film 17 as shown in FIG. 7F so as to finish preparation of a W damascene structure. In this embodiment, a silicon nitride film is used as the cap insulating film 17.

Figure 7G:
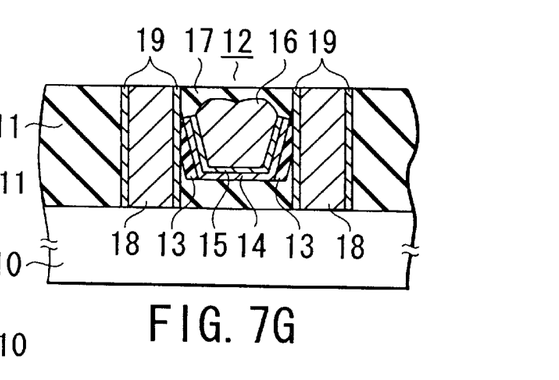

According to this embodiment, the titanium nitride film 14, which causes a short-circuiting, is not present in an upper portion of the side wall of the wiring groove 12. Therefore, even if an alignment failure has taken place in the step of forming a plug 18 in the interlayer insulating film 11 as shown in FIG. 7G, a short-circuiting does not take place between the tungsten film (W damascene wiring) 16 and the plug 18. Incidentally, a reference numeral 19 shown in FIG. 7G represents a titanium nitride film (barrier metal film).

It should also be noted that, in the fourth embodiment, a TEOS film is used as the interlayer insulating film 11 and a silicon nitride film is used as the cap insulating film 17. It follows that it is possible to etch selectively the interlayer insulating film 11 relative to the cap insulating film 17. As a result, it is unnecessary to cover the cap insulating film 17 with a resist film in forming the plug 18 shown in FIG. 7G.

It should also be noted that the width of the wiring groove 12 is diminished with progress in the degree of integration of the device, making it difficult to cover accurately the wiring groove 12 with a resist film. Particularly, when it comes to a damascene wiring structure, the aligning mark cannot be recognized because the surface is planarized. As a result, the pattern deviation tends to take place easily so as to make the above-noted problem more prominent. In the fourth embodiment, however, the difficulty need not be worried about because the cap insulating film need not be covered with a resist film.

Fifth Embodiment

It was unknown in the past to etch titanium nitride relative to tungsten with a selectivity ratio of titanium nitride to tungsten set at 1 or more by using a mixed aqueous solution system of 100° C. or less containing sulfuric acid and a hydrogen peroxide solution. Particularly, a batch etching method was quite unknown to the art. In the fifth embodiment, titanium nitride is etched relative to tungsten with a selectivity ratio of titanium nitride to tungsten set at 1 or more.

Figure 8:
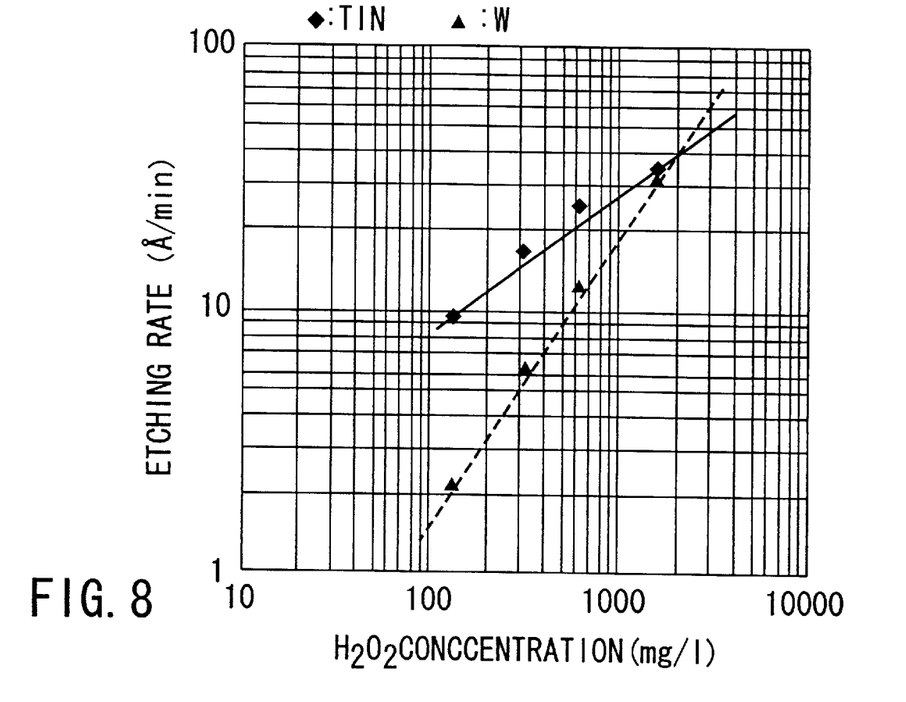
FIG. 8 is a graph showing the relationship between the etching rates of a TiN film and a W film and the concentration of the hydrogen peroxide solution (1/mg), covering the case where the TiN film and the W film were etched with a mixed solution containing a dilute sulfuric acid and a hydrogen peroxide solution.

FIG. 8 is a graph showing the relationship between the etching rate and the hydrogen peroxide concentration, covering the case where a TiN film and a W film are etched with a mixed aqueous solution containing a dilute sulfuric acid and a hydrogen peroxide solution. In this case, the concentration of the hydrogen peroxide solution is defined in terms of the mass (mg) of hydrogen peroxide relative to the volume (liter) of the mixed aqueous solution, i.e., mg/L.

The TiN film was formed by a sputtering method at 200° C. On the other hand, the W film was formed by an LP-CVD method using a mixed gas consisting of hydrogen, monosilane and tungsten hexafluoride. The mixed aqueous solution used for the etching was prepared by adding a hydrogen peroxide solution to a 10% dilute sulfuric acid. The temperature of the mixed aqueous solution was 80° C.

As apparent from FIG. 8, the selectivity ratio (TiN/W) is made 1 if the concentration of the hydrogen peroxide solution is lowered to about 1500 mg/L. It is also seen that, if the concentration of the hydrogen peroxide solution is further lowered to about 300 mg/L, the selectivity ratio is made higher than about 2.5.

FIG. 8 also shows that the etching rate is decreased with decrease in the absolute amount of hydrogen peroxide, and that a practical etching rate of titanium nitride can be ensured if the concentration of the hydrogen peroxide solution is set at about 100 to 300 mg/L.

The experimental data given in FIG. 8 support that, where the concentration of the hydrogen peroxide solution is about 1500 mg/L, both W and TiN are etched non-selectively, that, where the concentration exceeds 1500 mg/L, W is selectively etched, and that, where the concentration falls within a range of about 100 to 300 mg/L, TiN is selectively etched. What should be noted is that, according to the fifth embodiment of the present invention, titanium nitride can be etched easily selectively or non-selectively relative to tungsten by using a mixed solution of 100° C. or less consisting of sulfuric acid and a hydrogen peroxide solution. Where the evaporation of water generates a problem, the temperature of the mixed solution should be set at 90° C. or lower.

Figure 9:
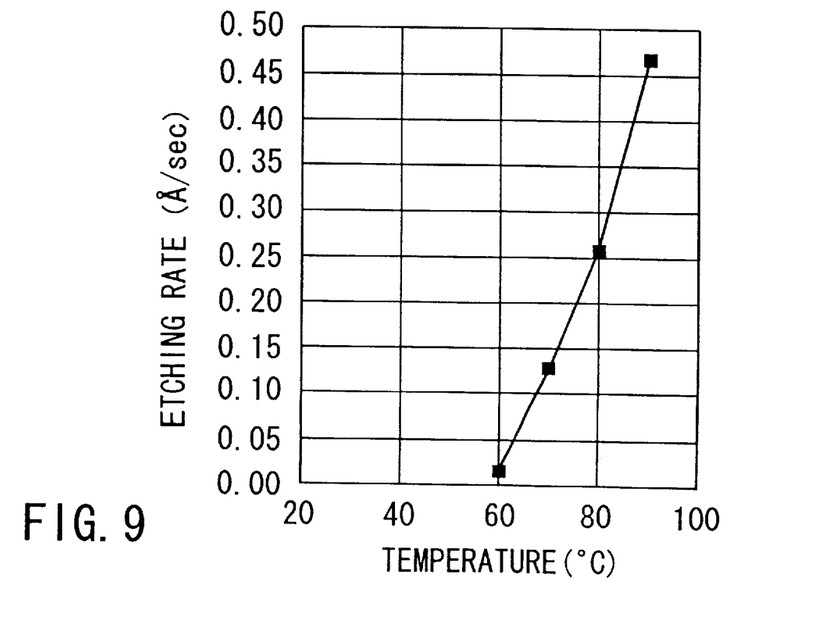
FIG. 9 is a graph showing the relationship between the etching rate of TiN with a mixed solution containing a dilute sulfuric acid and a hydrogen peroxide solution and the temperature of the mixed solution.

Further, the etching rates of W and TiN were measured by changing the temperature of a mixed aqueous solution having the same concentration of the hydrogen peroxide solution. The etching rates of both W and TiN were found to increase with increase in temperature. The present inventors continued a further research to find that it is necessary to set the temperature of the etching solution at 50° C. or more, preferably 70° C. or more in order to ensure a practical etching rate of titanium nitride, as shown in FIG. 9.

On the other hand, if a mixed aqueous solution consisting of a hydrochloric acid-based, not sulfuric acid-based, acidic solution and a hydrogen peroxide solution is maintained at a high temperature (80° C. or more), a reaction is carried out between hydrochloric acid and hydrogen peroxide to form hypochlorous acid, leading to a marked decrease in the concentration of the hydrogen peroxide solution. As a result, the etching rate is lowered.

Figure 10:
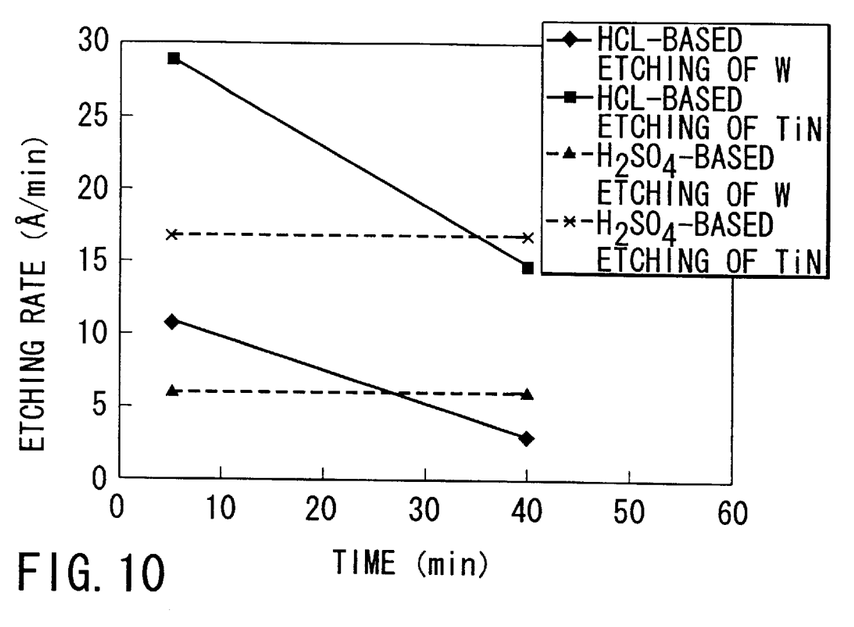
FIG. 10 is a graph showing the relationship between the etching rates of W and TiN and the etching time with respect to a mixed solution containing a dilute sulfuric acid and a hydrogen peroxide solution, and a mixed solution containing a sulfuric acid and a hydrogen peroxide solution.

To be more specific, tungsten and titanium nitride were etched by using a mixed aqueous solution consisting of a hydrochloric acid-based acidic solution and a hydrogen peroxide solution so as to measure the etching rates of tungsten and titanium nitride. As shown in FIG. 10, the etching rates of tungsten and titanium nitride, which were 1 nm/min and 3 nm/min, respectively, 5 minutes after the mixing of the solutions, were lowered to 0.3 nm/min and 1.5 nm/min, respectively, 40 minutes later.

On the other hand, where a hydrogen peroxide solution is added to a sulfuric acid-based acidic solution, a reaction does not take place between sulfuric acid and the hydrogen peroxide solution. Therefore, the decrease in the concentration of the hydrogen peroxide solution is caused solely by the self-decomposition of the hydrogen peroxide solution. As a matter of fact, the etching rates of tungsten and titanium nitride 5 minutes and 60 minutes later were found to be substantially constant at 0.6 nm/min and 1.6 nm/min, respectively, as shown in FIG. 10. In other words, the mixed solution consisting of a sulfuric acid-based acidic solution and a hydrogen peroxide solution has a life time as an etching solution that is longer than a life time of the mixed solution consisting of a hydrochloric acid-based acidic solution and a hydrogen peroxide solution. It follows that, in the case of using a mixed solution consisting of a sulfuric acid-based acidic solution and a hydrogen peroxide solution as an etching solution, it is possible to decrease the amount of the chemicals used for the etching. As a result, it is possible to realize an etching process of tungsten and titanium nitride, which does not produce an air pollution or water contamination problem and which is low in the etching cost.

Incidentally, it has been confirmed that a TiN film formed under different conditions can also be etched selectively relative to a W film. Specifically, the selectivity ratio of a TiN film formed by a sputtering method at a film forming temperature of 200° C. was found to be about 7, the selectivity ratio of a TiN film formed by a sputtering method at a film forming temperature of 400° C. was found to be about 11, and the selectivity ratio of a TiN film formed by an LP-CVD method was found to be about 15 relative to a W film formed by an LP-CVD method under the condition that the concentration of the hydrogen peroxide solution shown in FIG. 8 was set at 120 mg/L. It is considered reasonable to understand that the particular results have been derived from the phenomenon that the etching rate of the TiN film tends to be increased where the TiN film has a high crystal orientation, with the result that the selectivity ratio of the TiN film relative to the W film is increased with increase in the crystal orientation of the TiN film.

Sixth Embodiment

A wet etching process according to a sixth embodiment of the present invention will now be described. Described in this embodiment is a wet etching process using an apparatus comprising an inlet port for setting a carrier having a wafer put therein, a transfer device for transferring a wafer onto a transfer robot, a treating vessel for carrying out a wet etching treatment, a rinsing vessel for carrying out a rinsing treatment, and a dryer for carrying out a drying treatment. It is possible for the apparatus to include a plurality of treating vessels. It is also possible to use the same vessel or different vessels for carrying out the etching treatment and the rinsing treatment.

As described previously, where a mixed aqueous solution consisting of a sulfuric acid-based acidic solution and a hydrogen peroxide solution is maintained at a high temperature, a reaction does not take place between sulfuric acid and the hydrogen peroxide solution and, thus, the concentration of the hydrogen peroxide solution is not decreased. However, the concentration of the hydrogen peroxide solution is decreased by the self-decomposition of the hydrogen peroxide solution.

In order to diminish the effect produced by the decrease in the concentration of the hydrogen peroxide solution, it is necessary to set constant the time between preparation of the mixed aqueous solution consisting of the sulfuric acid-based acidic solution and the hydrogen peroxide solution and the timing of putting the wafer in the mixed aqueous solution in respect of all the wafers that are to be subjected to the wet etching treatment.

Figure 11:
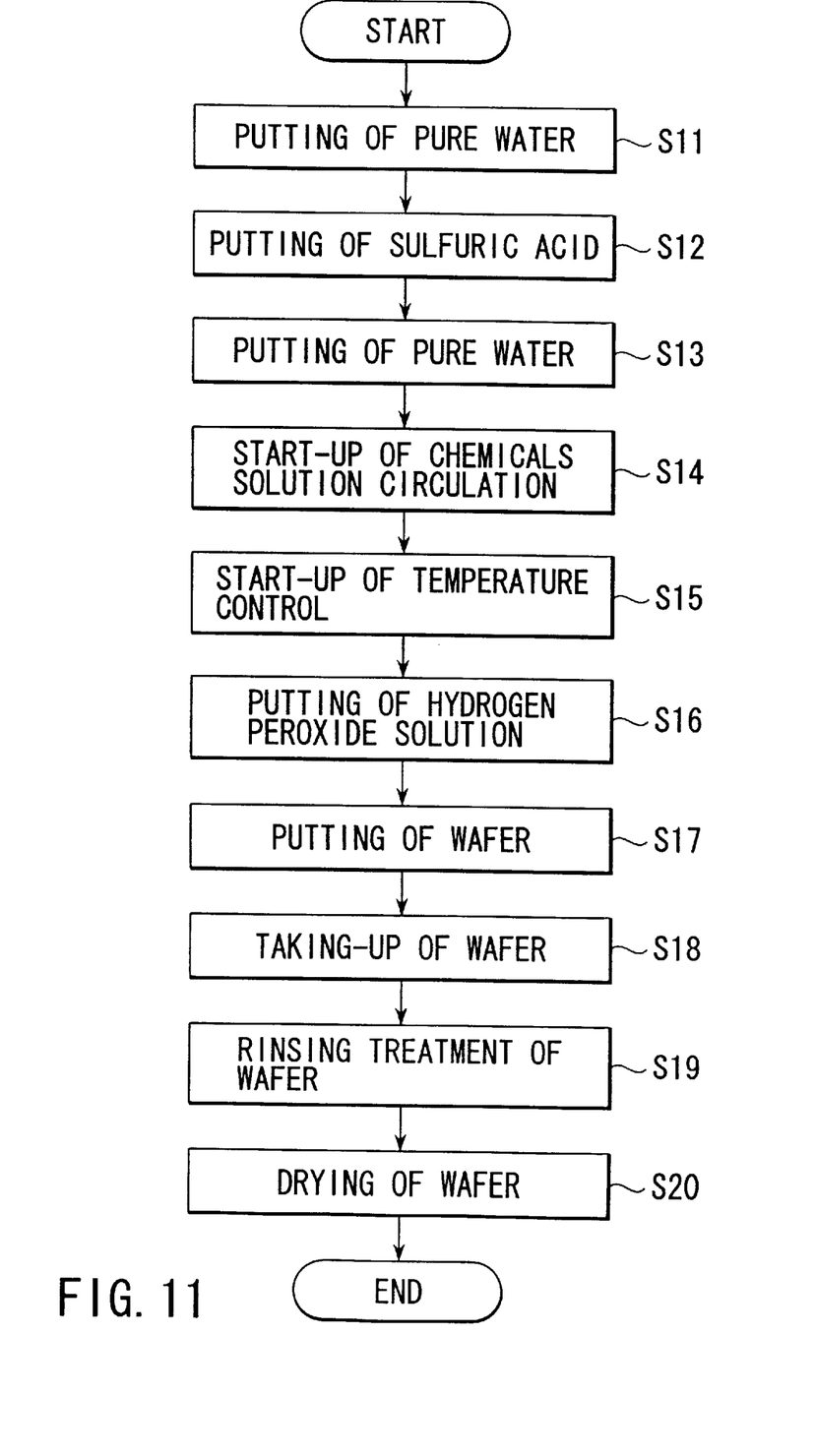
FIG. 11 is a flow chart showing a wet etching process including a sequence capable of preventing a non-uniform time until a wafer is put in a mixed aqueous solution containing a dilute sulfuric acid and a hydrogen peroxide solution.

To be more specific, the wafer is temporarily held waiting immediately before the wafer is put in the treating vessel, and a waiting signal denoting that the wafer is held waiting is supplied to a control system for controlling the pouring of the chemicals solution and the pure water into the treating vessel and for controlling the operation of the transfer robot. When the waiting signal is received by the control system, a hydrogen peroxide solution is poured into the treating vessel and a wafer is put in the treating vessel a predetermined time later. FIG. 11 exemplifies a flow chart of the wet etching process including the particular sequence (steps S16 and S17).

In the case of employing the particular sequence, it is possible to avoid the problem that, although a mixed aqueous solution is formed in a certain treating vessel, it is impossible to put the wafer in the treating vessel having the mixed aqueous solution formed therein because the transfer robot is being used in another treating vessel, with the result that the time required for putting the wafer in the mixed aqueous solution differs depending on the wafer. It follows that the sixth embodiment makes it possible to set constant the time between the pouring of the hydrogen peroxide solution and the putting of the wafer in the treating vessel, though it was difficult to set constant the time noted above when it comes to the conventional system including a plurality of treating vessels. As a result, the sixth embodiment of the present invention makes it possible to carry out a uniform wet etching treatment.

In steps S11 and S13 shown in FIG. 11, the processing temperature of about 80° C. is reached faster in the case of pouring a pure water warmed in advance to some extent. If sulfuric acid is added to a pure water (step S12), an exothermic reaction is brought about. By utilizing the temperature elevation of the pure water accompanying the exothermic reaction, the temperature of the warmed pure water that is to be put in the treating vessel can be set at a lower level. To be more specific, the heat generated by the exothermic reaction is not uselessly wasted by utilizing the heat generated by the exothermic reaction as a part of the heat energy required for realizing the processing temperature of 80° C. It follows that the exothermic reaction can be utilized effectively.

Seventh Embodiment

Figure 12:
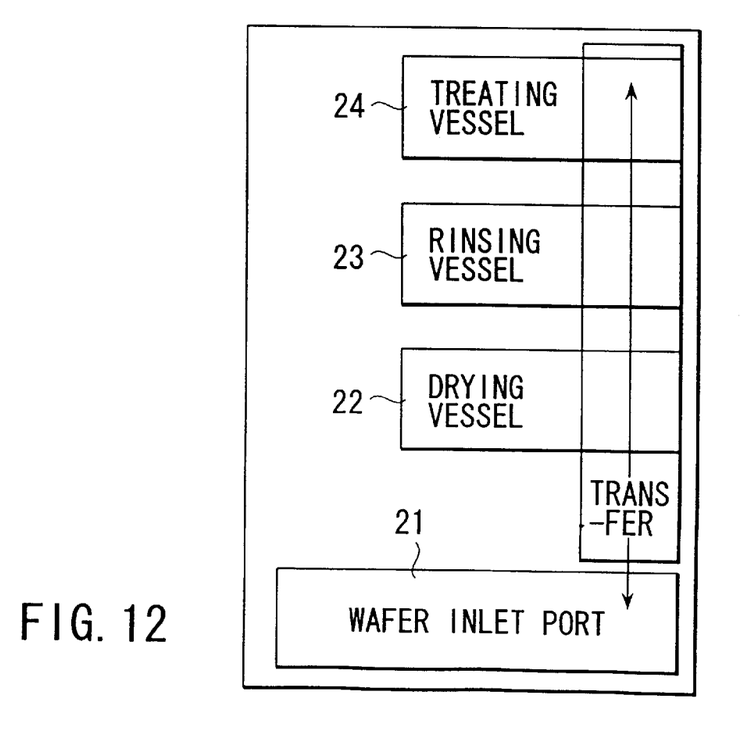
FIG. 12 schematically shows a wet processing apparatus used in a wet etching process according to seventh embodiment of the present invention.

FIG. 12 schematically shows a wet processing apparatus used in the wet etching process according to a seventh embodiment of the present invention. As shown in the drawing, the wet processing apparatus comprises a wafer inlet port 21, a dryer 22, a rinsing vessel 23 and a treating vessel 24.

The treating solution housed in the treating vessel 24 is circulated so as to be used repeatedly. FIG. 12 shows that the apparatus comprises a single treating vessel 24 and a single rinsing vessel 23. However, it is possible for the apparatus to comprise a plurality of treating vessels and a plurality of rinsing vessels.

Two kinds of sensors (not shown) are mounted in the treating vessel 24. One of these two sensors, i.e., a first sensor, is for measuring the total amount of the mixed chemicals solution housed in the treating vessel, and the other, i.e., a second sensor, is for measuring the concentration of the hydrogen peroxide within the treating vessel.

The reason for mounting the first sensor is as follows. Specifically, the pure water is evaporated during the treatment at a high temperature of 100° C. or more so as to decrease the amount of the total liquid. To overcome this difficulty, the first sensor is mounted so as to monitor the total liquid amount and a pure water is kept replenished to make up for the evaporated pure water. The pure water is replenished by a pure water replenishing mechanism (not shown). Incidentally, sulfuric acid is scarcely evaporated at the temperature of about 100° C., making it unnecessary to replenish sulfuric acid.

The first sensor consists of, for example, a liquid surface sensor for measuring the surface of the mixed chemicals solution housed in the treating vessel 24. On the other hand, the pure water replenishing mechanism serves to replenish a pure water when, for example, the liquid surface is made lower than a predetermined level until the predetermined level is restored. The pure water replenishment by the first sensor and the pure water replenishing mechanism can be achieved by, for example, a known feedback control.

The reason for mounting the second sensor is as follows. Specifically, a hydrogen peroxide solution reacts with various metal films in the etching step and, thus, the concentration of the hydrogen peroxide solution is lowered. To overcome this difficulty, the second sensor is mounted so as to monitor the concentration of the hydrogen peroxide, and hydrogen peroxide is kept replenished to make up for the hydrogen peroxide consumed by the reaction. Hydrogen peroxide is replenished by a hydrogen peroxide replenishing mechanism (not shown).

The second sensor consists of, for example, a concentration sensor for detecting the concentration of the hydrogen peroxide solution housed in the treating vessel 24. The hydrogen peroxide solution replenishing mechanism serves to replenish a hydrogen peroxide solution when the concentration of the hydrogen peroxide solution is made lower than a predetermined level until the predetermined level is restored. The replenishment of the hydrogen peroxide by the second sensor and the hydrogen peroxide replenishing mechanism can be achieved by, for example, a known feedback control.

It is possible to continue to perform the temperature adjustment and the concentration adjustment throughout the waiting time, though it is not absolutely necessary for the adjustment to be kept performed. For example, it is possible to perform the temperature adjustment and the concentration adjustment when, for example, the etching treatment is started.

Eighth Embodiment

FIGS. 13A to 13G are cross sectional views collectively showing a method of forming a W damascene wiring structure according to an eighth embodiment of the present invention.

Figure 13A:
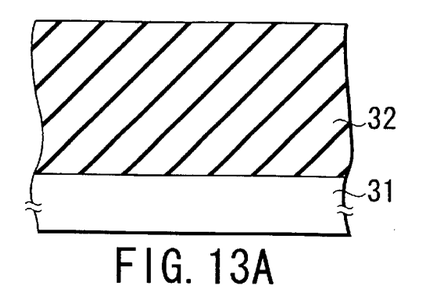
FIGS. 13A to 13G are cross sectional views collectively showing a method of forming a W damascene wiring structure according to eighth embodiment of the present invention.

In the first step, an interlayer insulating film 32 is formed on a silicon substrate 31 having an integrated device formed thereon in advance, as shown in FIG. 13A. In this embodiment, a TEOS film formed by a CVD method using TEOS as a raw material is used as the interlayer insulating film 32. It is also possible to use, for example, an SOG film formed by a coating method (SOD: Spin On Deposition) as the interlayer insulating film 32. In short, the material and the forming method of the interlayer insulating film 32 are not particular limited as far as it is possible to provide an interlayer insulating film having a required insulating property and a low dielectric constant.

Figure 13B:
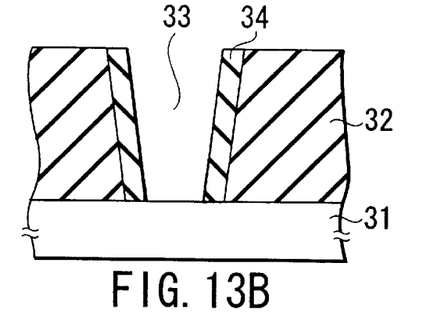

In the next step, a wiring groove 33 is formed on the surface of the interlayer insulating film 32, followed by forming a silicon nitride film 34 on the side wall of the wiring groove 33, as shown in FIG. 13B. The silicon nitride film 34 can be formed by depositing a silicon nitride film on the entire surface, followed by etching the entire surface of the silicon nitride film by RIE.

Figure 13C:
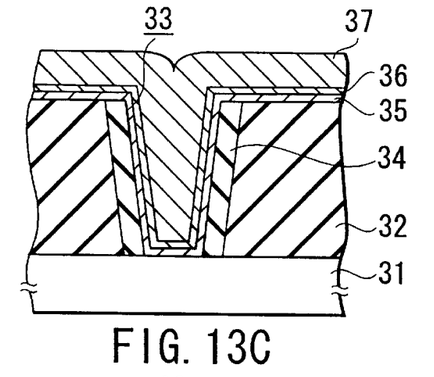

After formation of the silicon nitride film 34, a titanium nitride film 35 and a tungsten thin film 36 are deposited successively on the entire surface, as shown in FIG. 13C. The thickness of each of these titanium nitride film 35 and the tungsten thin film 36 is determined such that the wiring groove 33 is not filled completely with these titanium nitride film 35 and the tungsten thin film 36. Then, the wiring groove 33 is filled with a tungsten film 37. The tungsten film 37 is formed by, for example, an LP-CVD method under the conditions that a mixed gas consisting of hydrogen, monosilane and tungsten hexafluoride is used as the raw material gas and that the film is formed at 400 to 450° C.

Figure 13D:
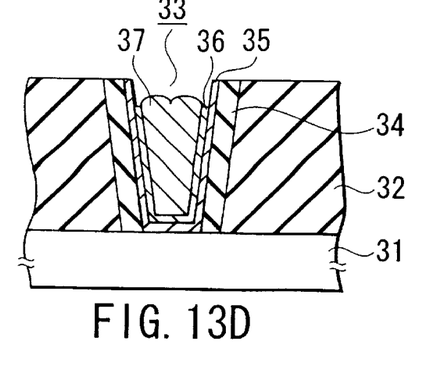

In the next step, those portions of the tungsten film 37, the tungsten thin film 36 and the titanium nitride film 35 which are positioned outside the wiring groove 33 are removed by CMP, followed by applying a dry etching such as RIE or a wet etching so as to retreat the tungsten thin film 36 and the tungsten film 37 positioned within the wiring groove 33, as shown in FIG. 13D. Where a seam is present in the tungsten film 37, the central portion of the tungsten film 37 is recessed, as shown in the drawing. Also, if the etching rate of the tungsten thin film 36 is somewhat lower than that of the tungsten film 37, the side wall portion can be made thinner than the wiring portion. In this case, the thickness of the tungsten film 37 remaining within the wiring groove 33 is made thinner in the side wall side portion than in the central portion of the wiring groove 33.

Figure 13E:
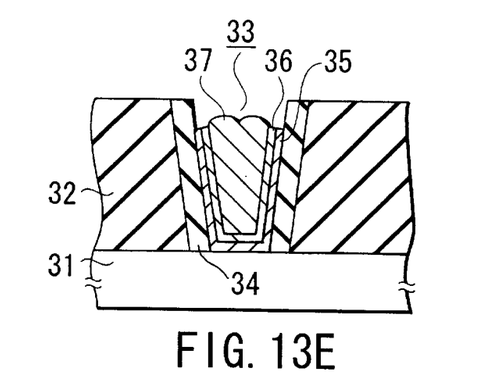

In the next step, the titanium nitride film 35 exposed to an upper portion of the side wall of the wiring groove 33 is selectively removed by a wet etching using a mixed aqueous solution containing sulfuric acid and a hydrogen peroxide solution, said mixed aqueous solution having a predetermined concentration of the hydrogen peroxide solution specified in the present invention, so as to allow the titanium nitride film 35 to retreat to a level substantially equal to the upper end of the tungsten thin film 36, as shown in FIG. 13E.

Figure 13F:
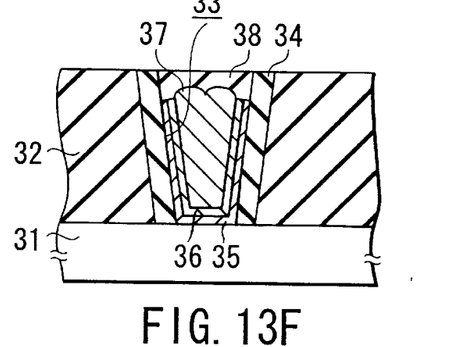

Finally, the wiring groove 33 is filled with a cap insulating film 38 so as to finish preparation of a W damascene wiring structure, as shown in FIG. 13F. In this embodiment, a silicon nitride film is used as the cap insulating film 38. However, the cap insulating film 38 is not limited to a silicon nitride film, as far as the cap insulating film 38 exhibits insulating properties and has a low dielectric constant.

Figure 13G:
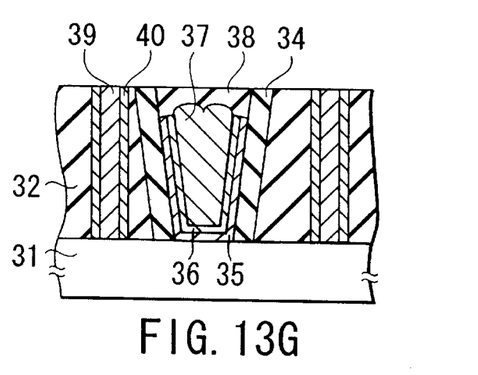

According to the eighth embodiment, the titanium nitride film 35 causing a short-circuiting is not present in an upper portion of the side wall of the wiring groove 33. Therefore, even if an alignment deviation has taken place in forming a plug 39 in the interlayer insulating film 32, short-circuiting does not take place between the tungsten film (W damascene wiring) 37 and the plug 39, as shown in FIG. 13G. Incidentally, a reference numeral 40 in FIG. 13G represents a titanium nitride film (barrier metal film).

Ninth Embodiment

In a damascene process, a Ti film is formed by a sputtering method in some cases before formation of a TiN film as a barrier metal by a sputtering method. In this case, it is necessary to remove the Ti film after completion of the selective etching of the TiN film.

However, the Ti film is scarcely etched with a solution containing a hydrogen peroxide solution. Therefore, it is necessary to use a solution prepared by removing hydrogen peroxide from a mixed aqueous solution containing sulfuric acid, hydrogen peroxide and water, said mixed aqueous solution having a predetermined concentration of the hydrogen peroxide solution specified in the present invention. In other words, it is necessary to use a dilute sulfuric acid for etching the Ti film.

The Ti film can be removed by two methods. Specifically, in the first method, the mixed aqueous solution noted above is discarded after removal of the TiN film, followed by removing the Ti film with a dilute sulfuric acid to which a hydrogen peroxide solution is not added. Alternatively, in the second method, after removal of the TiN film, the mixed aqueous solution is passed through a filter filtering the hydrogen peroxide solution so as to decrease the concentration of the hydrogen peroxide solution. The second method will now be described in the following.

Figure 14:
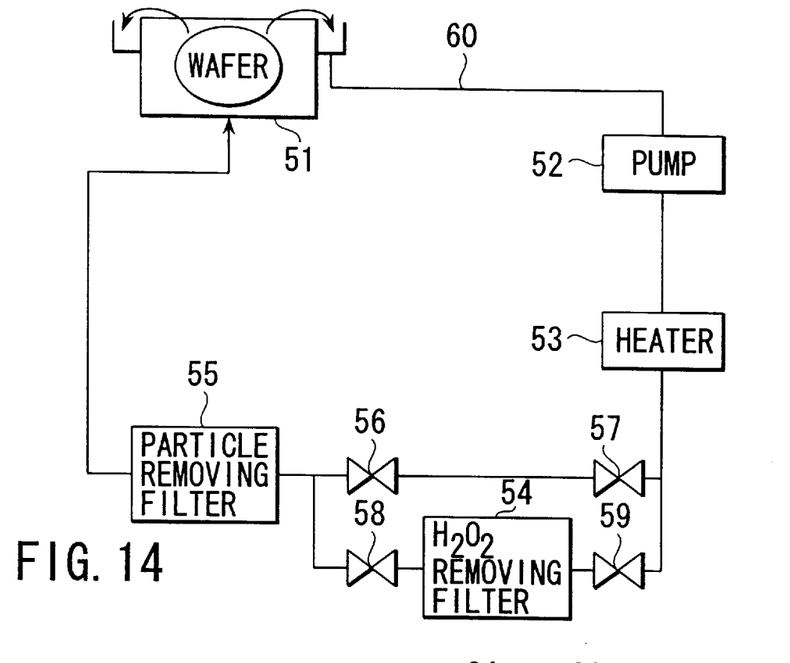
FIG. 14 exemplifies a wet etching system for performing the wet etching according to ninth embodiment of the present invention.

FIG. 14 exemplifies a wet etching system for carrying out the second method. As shown in the drawing, the wet etching system comprises a treating vessel 51 for carrying out an etching treatment, a pump 52 for circulating an etching solution through the treating vessel 51, a heater 53 for heating the etching solution, a hydrogen peroxide ($H_2O_2$) removing filter 54, e.g., an activated carbon filter, for removing hydrogen peroxide from the etching solution, and a particle removing filter 55 for removing particles contained as impurities in the etching solution. Reference numerals 56 to 59 shown in the drawing represent valves, and the reference numeral 60 represents a pipe. It is desirable to use the valves 56 and 58 because the flow of the etching solution flowing through the pipe 60 can be controlled as desired without fail, though it is not absolutely necessary to use these valves.

The etching method in this embodiment will now be described.

In the first step, a pure water and sulfuric acid are put in the treating vessel 51 for preparing a dilute sulfuric acid diluted with a pure water. Then, the pump 52 is operated with the valves 56 and 57 opened and with the valves 58 and 59 closed so as to circulate the dilute sulfuric acid housed in the treating vessel 51 through the pipe 60 such that the dilute sulfuric acid passes through the pump 52, the heater 53, the particle removing filter 55 and the treating vessel 51. During the circulation, the particles contained in the dilute sulfuric acid diluted with the pure water are removed, with the result that the sulfuric acid is diluted with an ultra pure water. Also, the sulfuric acid diluted with the ultra pure water is heated by the heater 53 during the circulation so as to be maintained at a predetermined temperature.

In the next step, a hydrogen peroxide solution is added to the sulfuric acid diluted with the ultra pure water, which is housed in the treating vessel 51 and maintained at a predetermined temperature, so as to form a mixed aqueous solution containing sulfuric acid and a hydrogen peroxide solution, said mixed solution having a predetermined concentration of the hydrogen peroxide solution specified in the present invention.

In the next step, a wafer (semiconductor substrate) as a substrate to be treated having a tungsten film and a titanium nitride film formed thereon is kept dipped in the mixed aqueous solution housed in the treating vessel 51 for a predetermined time so as to selectively remove by etching the titanium nitride film.

The specific example of the substrate to be treated includes a silicon substrate constructed as shown in, for example, FIG. 13D. In this case, the mixed aqueous solution is circulated through the route described previously and the temperature of the mixed aqueous solution is controlled, as in the dilute sulfuric acid diluted with a pure water.

Then, the pump 52 is operated with the valves 56 and 57 closed and with the valves 58 and 59 opened so as to circulate the mixed aqueous solution housed in the treating vessel 51 through the pipe 60 such that the mixed aqueous solution passes through the pump 52, the heater 53, the $H_2O_2$ removing filter 54, the particle removing filter 55 and the treating vessel 51.

By circulating the mixed aqueous solution for a predetermined time through the route described above, the concentration of the hydrogen peroxide solution in the mixed aqueous solution is set at 1 mg/L or lower. This step can be performed after the wafer is taken out of the treating vessel 51 or with the wafer kept dipped in the mixed aqueous solution housed in the treating vessel 51. In the former case, the wafer is kept dipped again for a predetermined time in the aqueous solution housed in the treating vessel 51 and having the hydrogen peroxide solution concentration of 1 mg/L or lower so as to selectively remove the titanium film by etching. On the other hand, in the latter case, the selective removal of the titanium film by etching is started while the hydrogen peroxide solution is being removed.

Employed in the ninth embodiment is a wet etching in which the mixed aqueous solution passes through the particle removing filter 55 in the step of setting the concentration of the hydrogen peroxide solution in the mixed aqueous solution at 1 mg/L or lower. However, it is also possible to employ a wet etching in which the mixed aqueous solution does not pass through the particle removing filter 55 in the step noted above.

The present invention is not limited to the embodiments described above. For example, the damascene wiring in the fourth embodiment was a single damascene wiring. However, the technical idea of the present invention can also be applied to a dual damascene wiring. Also, a titanium nitride film was selectively etched in each of the fourth and eighth embodiments for realizing a W damascene wiring structure. However, a similar W damascene wiring structure can also be realized by etching non-selectively (etching at the same etching rate) the tungsten thin film, the tungsten film and the titanium nitride film. In this case, it is possible to omit the step, e.g., RIE step, of removing the upper portion of the tungsten film shown in FIG. 7D or FIG. 13E so as to decrease the number of treating steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising an etching step for selectively etching titanium nitride relative to tungsten by using a mixed solution containing hydrochloric acid and a hydrogen peroxide solution, the molar ratio of hydrogen peroxide in said hydrogen peroxide solution to hydrogen chloride in said hydrochloric acid being 1/10 or less.

2. The method of manufacturing a semiconductor device according to claim 1, wherein the mass percentage of said hydrogen chloride based on said solution is 3.5% or less.

3. A method of manufacturing a semiconductor device, comprising the step of non-selectively etching titanium nitride and tungsten by using a solution containing hydrochloric acid and a hydrogen peroxide solution, the molar ratio of hydrogen peroxide in said hydrogen peroxide solution to hydrogen chloride in said hydrochloric acid falling within a range of between 1/10 and 4/10.

4. The method of manufacturing a semiconductor device according to claim 3, wherein the mass percentage of said hydrogen chloride to said solution falls within a range of between 3.5% and 14%.

5. The method of manufacturing a semiconductor device according to claim 1, wherein said solution is used at 50° C. or higher.

6. The method of manufacturing a semiconductor device according to claim 3, wherein said solution is used at 50° C. or higher.

7. The method of manufacturing a semiconductor device according to claim 1, wherein said solution is used at 50° C. or higher.

8. The method of manufacturing a semiconductor device according to claim 2, wherein said solution is used at 50° C. or higher.

9. The method of manufacturing a semiconductor device according to claim 3, wherein said solution is used at 50° C. or higher.

10. The method of manufacturing a semiconductor device according to claim 4, wherein said solution is used at 50° C. or higher.

11. A method of manufacturing a semiconductor device, comprising the steps of:

putting hydrochloric acid in a treating vessel for carrying out an etching treatment;

putting a hydrogen peroxide solution in said treating vessel; and dipping a substrate to be treated, which has a tungsten film and a titanium nitride film formed thereon, in said treating vessel a predetermined time after putting of said hydrogen peroxide solution in the treating vessel, wherein the molar ratio of hydrogen peroxide in said hydrogen peroxide solution to hydrogen chloride in said hydrochloric acid is 1/100 or less when said substrate is put in the treating vessel.

12. The method of manufacturing a semiconductor device according to claim 11, wherein the mass percentage of said hydrogen chloride based on said hydrochloric acid and said hydrogen peroxide solution is 0.35% or less when the substrate is put in the treating vessel.

13. A method of manufacturing a semiconductor device, comprising the steps of:

putting a solution containing hydrochloric acid and a hydrogen peroxide solution in a treating vessel for carrying out an etching treatment;

measuring the concentrations of hydrochloric acid and hydrogen peroxide solution in said solution for controlling the concentrations of said hydrogen chloride and said hydrogen peroxide in said solution such that, when the molar ratio of hydrogen peroxide in said hydrogen peroxide solution to hydrogen chloride in said hydrochloric acid is larger than 1/100, said molar ratio is made not larger than 1/100; and dipping a substrate to be treated, which has a tungsten film and a titanium nitride film formed thereon, in said treating vessel when the molar ratio of hydrogen peroxide in said hydrogen peroxide solution to hydrogen chloride in said hydrochloric acid is made not larger than 1/100.

14. The method of manufacturing a semiconductor device according to claim 13, wherein the concentrations of said hydrochloric acid and said hydrogen peroxide solution are measured in the step of controlling the concentrations of said hydrogen chloride and said hydrogen peroxide in said solution and, when the mass percentage of said hydrogen chloride based on said solution is larger than 0.35%, the concentrations of said hydrogen chloride and said hydrogen peroxide in said solution are controlled at a level not higher than 0.35%.

15. A method of manufacturing a semiconductor device, wherein, when a titanium nitride film is selectively etched relative to a tungsten film by using a solution containing sulfuric acid, hydrogen peroxide and water, a ratio of the mass (mg) of hydrogen peroxide in said solution to the volume (L) of said solution is set at 1000 or less.

16. The method of manufacturing a semiconductor device according to claim 15, wherein said ratio is 300 or less.

17. The method of manufacturing a semiconductor device according to claim 15, wherein said solution is used at 50° C. or higher.

18. The method of manufacturing a semiconductor device according to claim 15, wherein said solution is used at temperatures falling within a range of between 70° C. and 100° C.

19. A method of manufacturing a semiconductor device, comprising the steps of:

putting water and sulfuric acid in a treating vessel for carrying out an etching treatment to form a first solution containing a dilute sulfuric acid in said treating vessel;

decreasing the impurities contained in said first solution housed in said treating vessel and maintaining constant the temperature of the first solution housed in said treating vessel;

adding a hydrogen peroxide solution to the first solution housed in the treating vessel to form a second solution containing sulfuric acid, hydrogen peroxide and water in the treating vessel; and dipping a substrate to be treated, which has a tungsten film and a titanium nitride film formed thereon, in said second solution housed in the treating vessel for selectively etching said titanium nitride film relative to said tungsten film, a ratio of the mass (mg) of said hydrogen peroxide to the volume (L) of said second solution being set at 1000 or less when said substrate is dipped in said second solution housed in the treating vessel.

20. The method of manufacturing a semiconductor device according to claim 19, wherein said ratio is 300 or less.

21. The method of manufacturing a semiconductor device according to claim 19, wherein said ratio is 100 or more.

22. The method of manufacturing a semiconductor device according to claim 19, wherein the temperature of said solution is kept constant at a level falling within a range of between 50° C. and 100° C.

23. The method of manufacturing a semiconductor device according to claim 19, wherein the impurities of said first solution are decreased by repeating a series of steps of taking out said first solution from within the treating vessel, passing the first solution taken out of the treating vessel through a filter for removing the impurities, and returning the first solution passing through said filter back to the treating vessel.

24. The method of manufacturing a semiconductor device according to claim 19, further comprising the steps of:

forming a third solution within said treating vessel by decreasing the amount of said hydrogen peroxide contained in said second solution housed in the treating vessel after selective etching of said titanium nitride film relative to said tungsten film, a titanium film being formed below the titanium nitride film formed on said substrate;

setting a ratio of the mass (mg) of said hydrogen peroxide to the volume (L) of said third solution at 1 or less; and etching said titanium film exposed after the etching of said titanium nitride film by using the third solution.

25. The method of manufacturing a semiconductor device according to claim 24, wherein the amount of hydrogen peroxide in said second solution is decreased by repeating a series of steps of taking the second solution out of the treating vessel, passing the second solution taken out of the treating vessel through a filter for removing hydrogen peroxide, and returning the second solution passing through said filter to the treating vessel.

* * * * *